United States Patent
Tsai

(10) Patent No.: US 10,134,480 B1
(45) Date of Patent: Nov. 20, 2018

(54) VOLTAGE GENERATOR AND FLASH MEMORY THEREOF

(71) Applicant: Winbond Electronics Corp., Taichung (TW)

(72) Inventor: Shih-Ming Tsai, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/668,683

(22) Filed: Aug. 3, 2017

(30) Foreign Application Priority Data

May 4, 2017 (TW) .............................. 106114758 A

(51) Int. Cl.
  *G11C 16/34* (2006.01)
  *H02M 3/07* (2006.01)
  *G11C 16/08* (2006.01)

(52) U.S. Cl.
  CPC .......... *G11C 16/3436* (2013.01); *G11C 16/08* (2013.01); *H02M 3/07* (2013.01)

(58) Field of Classification Search
  CPC ............................ G11C 16/3436; G11C 16/08
  USPC ....................................................... 365/185.2
  See application file for complete search history.

(56) References Cited

U.S. PATENT DOCUMENTS

| 7,474,082 | B2 * | 1/2009 | Huang | G06F 1/26 323/222 |
| 9,106,128 | B2 | 8/2015 | Lee et al. | |
| 9,270,259 | B2 | 2/2016 | Chang | |
| 2004/0022112 | A1 * | 2/2004 | Tran | G11C 5/145 365/226 |
| 2007/0140003 | A1 * | 6/2007 | Ido | G11C 8/08 365/185.2 |
| 2008/0043537 | A1 * | 2/2008 | Tanikawa | G06F 11/1004 365/185.23 |
| 2009/0295462 | A1 | 12/2009 | Itoh | |
| 2011/0255347 | A1 * | 10/2011 | Mori | G11C 7/18 365/185.25 |
| 2012/0250412 | A1 * | 10/2012 | Lee | G11C 16/12 365/185.11 |

FOREIGN PATENT DOCUMENTS

| TW | I345760 | 7/2011 |
| TW | I473401 | 2/2015 |

OTHER PUBLICATIONS

"Office Action of Taiwan Counterpart Application," dated Dec. 15, 2017, p. 1-p. 8, in which the listed references were cited.

\* cited by examiner

*Primary Examiner* — Hoai V Ho
*Assistant Examiner* — Muna A Techane
(74) *Attorney, Agent, or Firm* — JCIPRNET

(57) ABSTRACT

A voltage generator and a flash memory thereof are provided. The voltage generator is used to provide a work reference voltage having a plurality of reference levels to a word line decoder circuit and includes a plurality of voltage trimming circuits. The voltage trimming circuits are connected in series between the work reference voltage and a ground voltage and respectively receive a trimming code, wherein the voltage levels of the work reference voltages are controlled by the trimming codes received by the voltage trimming circuits to select one of the reference levels.

8 Claims, 2 Drawing Sheets

VOLTAGE GENERATOR AND FLASH MEMORY THEREOF

CROSS-REFERENCE TO RELATED APPLICATION

This application claims the priority benefit of Taiwan application serial no. 106114758, filed on May 4, 2017. The entirety of the above-mentioned patent application is hereby incorporated by reference herein and made a part of this specification.

BACKGROUND OF THE INVENTION

Field of the Invention

The invention relates to a voltage generator and more particularly relates to a voltage generator and a flash memory thereof.

Description of Related Art

When a flash memory is operated, the operation of writing or erasing requires a specific voltage to inject charges into or draw charges from the floating gate. Thus, a charge-pump circuit or a voltage generator is needed so as to provide the voltage for the operation. In order to execute the operation effectively and accurately, an ideal method is to bias the voltage that has been trimmed by a linear step voltage. Besides, in order to obtain a programmable voltage, a feedback resistor may be divided into a series of resistors of smaller resistances, each of which is connected in parallel to a switch.

However, when the switch has an excessive cross voltage, punch-through breakdown may occur and make it difficult to correctly lock the trimmed voltage. Moreover, as each resistor is connected in parallel to the switch, the circuit area cannot be reduced. Therefore, the flash memory requires a new voltage generator that better meets the users' requirements.

SUMMARY OF THE INVENTION

The invention provides a voltage generator and a flash memory thereof, capable of preventing occurrence of punch-through breakdown in a switch component of a voltage trimming circuit.

A voltage generator of the invention is adapted to provide a work reference voltage having a plurality of reference levels to a word line decoder circuit and includes a plurality of voltage trimming circuits. The voltage trimming circuits are connected in series between the work reference voltage and a ground voltage and respectively receive a trimming code, wherein a voltage level of the work reference voltage is controlled by the trimming codes received by the voltage trimming circuits to select one of the reference levels.

A flash memory of the invention includes a memory array, a word line decoder circuit, and the aforementioned voltage generator. The word line decoder circuit receives a work reference voltage and a row address to provide a row selection voltage to the memory array. The aforementioned voltage generator is coupled to the word line decoder circuit to provide the work reference voltage and receives a voltage adjustment signal to adjust a voltage level of the work reference voltage, wherein the voltage adjustment signal has a plurality of trimming codes.

Based on the above, in the voltage generator and the flash memory thereof, through voltage division of multiple voltage trimming circuits, the switch components (e.g., thin film transistors) in the voltage trimming circuits are prevented from having an excessive voltage, which may lead to punch-through breakdown. Thereby, the voltage level of the work reference voltage may be locked correctly.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1:
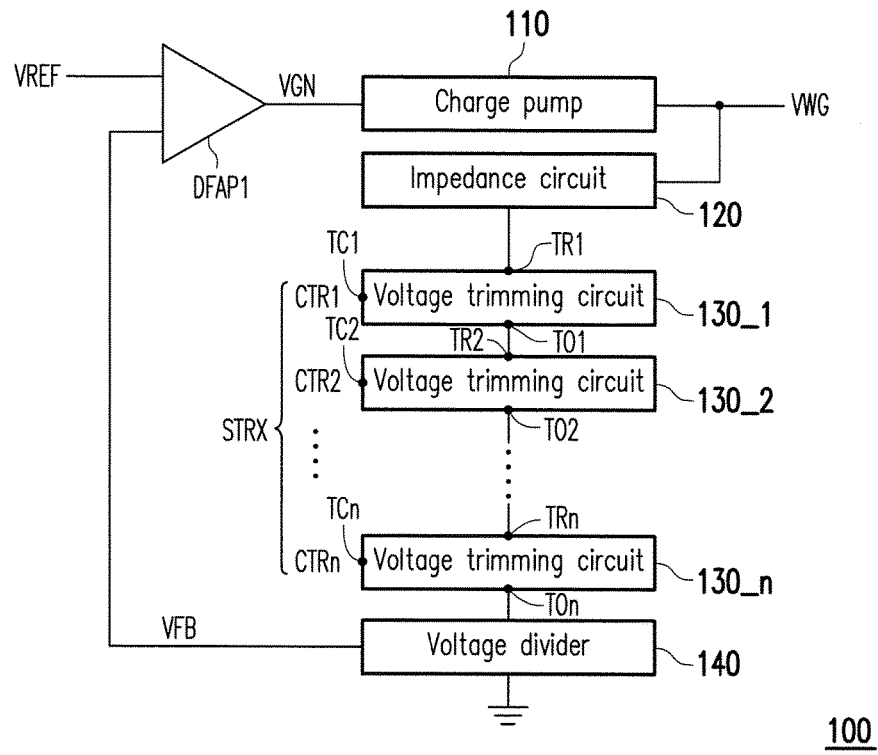
FIG. 1 is a system diagram of a voltage generator according to an embodiment of the invention.
Figure 4:
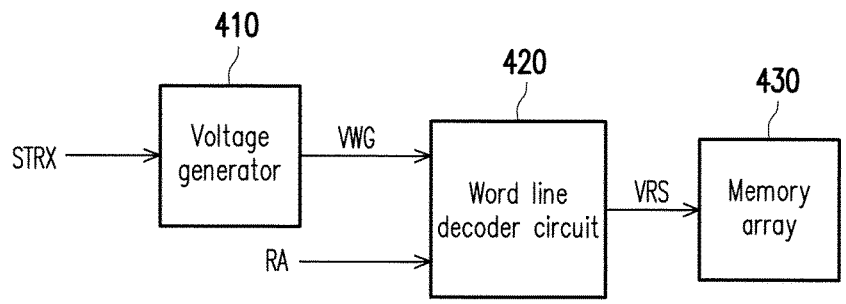
FIG. 4 is a system diagram of a flash memory according to an embodiment of the invention.

Referring to FIG. 1, in this embodiment, a voltage generator 100 is adapted to provide a work reference voltage VWG having a plurality of reference levels to a word line decoder circuit (e.g., 420 as shown in FIG. 4), and the voltage generator 100 includes a charge pump 110, an impedance circuit 120, a plurality of voltage trimming circuits 130_1 to 130_n, a voltage divider 140, and a differential amplifier DFAP1.

An input end of the differential amplifier DFAP1 is coupled to the voltage divider 140 to receive a feedback voltage VFB provided by the voltage divider 140 and another input end of the differential amplifier DFAP1 receives an operation reference voltage VREF, and an output end of the differential amplifier DFAP1 is coupled to the charge pump 110 to provide a gain voltage VGN to the charge pump 110. The charge pump 110 is coupled to the output end of the differential amplifier DFAP1 to receive the gain voltage VGN, so as to provide the work reference voltage VWG.

The impedance circuit 120, the voltage trimming circuits 130_1 to 130_n, and the voltage divider 140 are coupled in series between the work reference voltage VWG and a ground voltage, wherein n is a positive integer larger than or equal to 2. In this embodiment, the impedance circuit 120 is disposed (or coupled) between the voltage trimming circuits 130_1 to 130_n and the work reference voltage VWG, and the voltage divider 140 is disposed (or coupled) between the voltage trimming circuits 130_1 to 130_n and the ground voltage. Nevertheless, the invention is not limited thereto.

The voltage trimming circuits 130_1 to 130_n respectively receive one of a plurality of trimming codes CTR1 to CTRn of a voltage adjustment signal STRX, and a voltage level of the work reference voltage VWG is controlled by the voltage adjustment signal STRX (i.e., the trimming codes CTR1 to CTRn received by the voltage trimming circuits 130_1 to 130_n) to select one of the reference levels corresponding to voltage levels of the voltage adjustment signal STRX.

Through voltage division of the voltage trimming circuits 130_1 to 130_n, switch components (e.g., thin film transistors) in the voltage trimming circuits 130_1 to 130_n may be prevented from having an excessive voltage, which leads to punch-through breakdown. Thereby, the voltage level of the work reference voltage VWG can be locked correctly.

In this embodiment, the voltage trimming circuits 130_1 and 130_n respectively have an input end (e.g., TR1 to TRn), a control end (e.g., TC1 to TCn), and an output end (e.g., TO1 to TOn). The input end TR1 of the voltage trimming circuit 130_1 is coupled to the work reference voltage VWG via the impedance circuit 120, the control end TC1 of the voltage trimming circuit 130_1 receives the corresponding trimming code CTR1, and the output end TO1 of the voltage trimming circuit 130_1 is coupled to the input end TR2 of the following voltage trimming circuit 130_2. The input end TR2 of the voltage trimming circuit 130_2 is coupled to the output end TO1 of the previous voltage trimming circuit 130_1, the control end TC2 of the voltage trimming circuit 130_2 receives the corresponding trimming code CTR2, and the output end TO2 of the voltage trimming circuit 130_2 is coupled to the input end TR3 of the following voltage trimming circuit 130_3. The coupling relationship between the other voltage trimming circuits (e.g., 130_3 to 130_n) may be inferred from the above accordingly. The output end TOn of the voltage trimming circuit 130_n is coupled to the ground voltage via the voltage divider 140.

In the embodiment of the invention, the voltage trimming circuits 130_1 to 130_n may respectively receive the trimming codes CTR1 to CTRn having different bit numbers. Alternatively, the voltage trimming circuits 130_1 to 130_n may receive the trimming codes CTR1 to CTRn having the same bit number. For example, in the case where the trimming codes CTR1 to CTRn have different bit numbers, the trimming code (CTR1 to CTRn) received by the voltage trimming circuit (130_1 to 130_n) closer to the work reference voltage VWG has a larger bit number while the trimming code (CTR1 to CTRn) received by the voltage trimming circuit (130_1 to 130_n) closer to the ground voltage has a smaller bit number.

Figure 2:
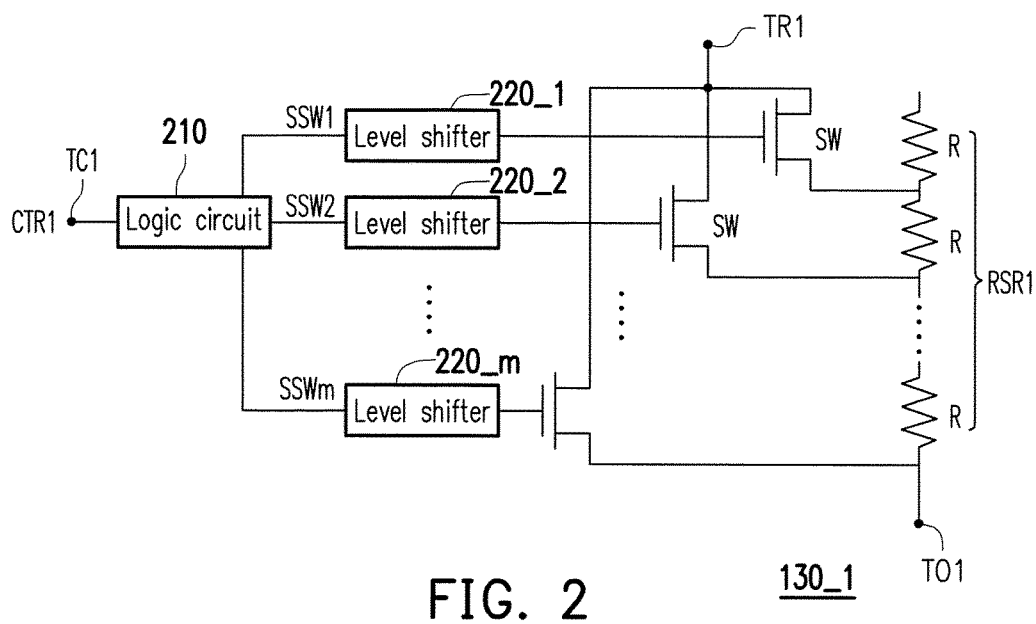
FIG. 2 is a circuit diagram of a voltage trimming circuit according to an embodiment of the invention.

Referring to FIG. 1 and FIG. 2, the voltage trimming circuit 130_1 is described here as an example. The voltage trimming circuits 130_2 to 130_n have circuit structures similar to the circuit structure of the voltage trimming circuit 130_1 and thus details thereof are not repeated hereinafter. In this embodiment, the voltage trimming circuit 130_1 includes a logic circuit 210, a plurality of level shifters 220_1 to 220_m, a plurality of switches SW, and a resistor series RSR1, wherein m is a positive integer and is $2^i$, and i is the same as the bit number of the trimming code CTR1 (i.e., a positive integer larger than or equal to 1), and the number of the level shifters 220_1 to 220_m is the same as the number of the switches SW.

The resistor series RSR1 is coupled to the output end TO1 of the voltage trimming circuit 130_1 and includes a plurality of resistors R connected in series with one another, wherein each of the resistors R has a first end (the upper end shown in the figure) and a second end (the lower end shown in the figure), and the first end of each resistor R is coupled to the second end of the resistor R above (the upper side in the figure) and the first end of the uppermost resistor R is floating (i.e., dead connecting). A first end of the switch SW is coupled to the input end TR1 of the voltage trimming circuit 130_1, a second end of the switch SW is coupled to the second end of the corresponding resistor R, and a control end of the switch SW is coupled to the corresponding level shifters 220_1 to 220_m.

The logic circuit 210 receives the corresponding trimming code CTR1 to provide a plurality of switch signals SSW1 to SSWm to the level shifters 220_1 to 220_m and enables one of the switch signals SSW1 to SSWm while the other switch signals SSW1 to SSWm are disabled. The level shifters 220_1 to 220_m are respectively coupled between the logic circuit 210 and the control ends of the switches SW and control the switches according to the switch signals SSW1 to SSWm. Next, when the level shifters 220_1 to 220_m are enabled, the level shifters 220_1 to 220_m turn on the switches SW coupled thereto; and when the level shifters 220_1 to 220_m are disabled, the level shifters 220_1 to 220_m turn off the switches SW coupled thereto. In other words, in the voltage trimming circuit 130_1, at any time, only one of the switches SW is turned on.

Figure 3:
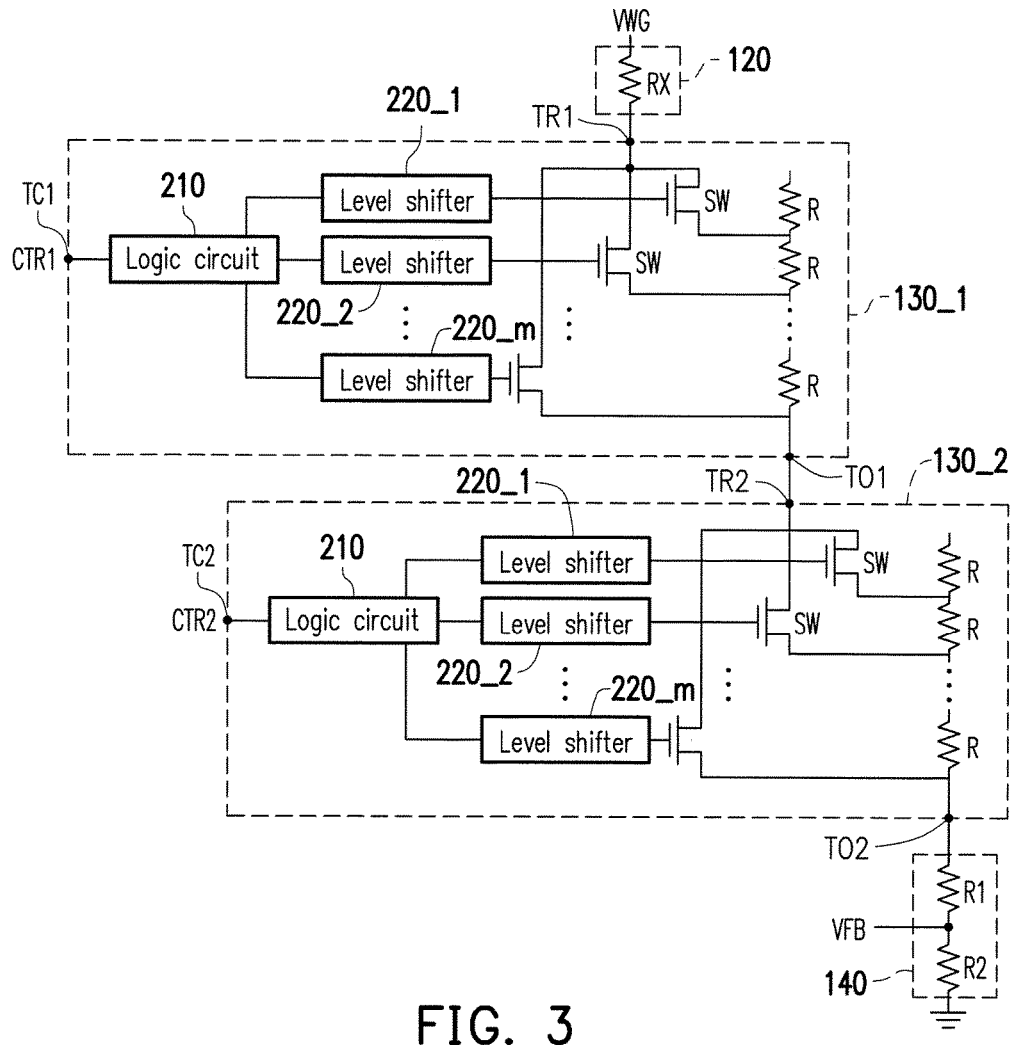
FIG. 3 is a circuit diagram of an impedance circuit, a voltage trimming circuit, and a voltage divider according to an embodiment of the invention.

Referring to FIG. 1 to FIG. 3, in this embodiment, only the impedance circuit 120, the two voltage trimming circuits 130_1 and 130_2, and the voltage divider 140 are illustrated. Here, the impedance circuit 120 includes a resistor RX, and the voltage divider 140 includes a resistor R1 and a resistor R2 that are connected in series, for example.

The circuit structures of the voltage trimming circuits 130_1 and 130_2 have been described in the embodiment with reference to FIG. 2, but the resistance of the resistor R may be set as required. For example, provided that the voltage adjustment signal STRX is a 6-bit signal, that is, 64-step adjustment is possible, and the trimming codes CTR1 and CTR2 are both 3 bits, the number of the resistors R and the switches SW in the voltage trimming circuits 130_1 and 130_2 is 8 (i.e., $2^3$), but the resistance of the resistor R of the voltage trimming circuit 130_1 may be 1 unit resistance and the resistance of the resistor R of the voltage trimming circuit 130_2 may be 8 unit resistances. That is, the voltage trimming circuit 130_1 may perform step voltage adjustment in the unit of 1 step (i.e., fine trim) while the voltage trimming circuit 1302 may perform step voltage adjustment in the unit of 8 steps (i.e., coarse trim). Through a combination of the switches SW of the voltage trimming circuits 130_1 and 130_2, 64-step voltage adjustment may be achieved with use of fewer switches SW. In other words, the circuit area for forming the switch components is saved.

Nevertheless, the invention is not limited thereto. In other embodiments, the resistance of the resistor R of the voltage trimming circuit 130_1 may be 8 unit resistances while the resistance of the resistor R of the voltage trimming circuit 130_2 may be 1 unit resistance, which may be decided by those skilled in the art.

In another embodiment, it is provided that the trimming codes CTR1 and CTR2 are 4 bits and 2 bits. In this case, the number of the resistors R and the switches SW in the voltage trimming circuit 130_1 is 16 (i.e., $2^4$) while the number of the resistors R and the switches SW in the voltage trimming circuit 130_2 is 4 (i.e., $2^2$). Moreover, the resistance of the resistor R of the voltage trimming circuit 130_1 may be 1 unit resistance while the resistance of the resistor R of the voltage trimming circuit 130_2 may be 16 unit resistances. That is, the voltage trimming circuit 130_1 may perform step voltage adjustment in the unit of 1 step while the voltage trimming circuit 130_2 may perform step voltage adjustment in the unit of 16 steps. Likewise, through a combination of the switches SW of the voltage trimming circuits 130_1 and 130_2, 64-step voltage adjustment may be achieved, and the circuit area for forming the switch components is saved.

In the above embodiment, the voltage trimming circuits 130_1 to 130_n all include the resistor series. Therefore, in some of the embodiments, the impedance circuit 120 may be omitted. In addition, in some of the embodiments, the feedback voltage VFB may be extracted by the resistor series of the voltage trimming circuits 130_1 to 130_n. In other words, the voltage divider 140 may be omitted. Nevertheless, the above may be decided according to the circuit design, and the invention is not limited thereto.

Referring to FIG. 1 to FIG. 4, in this embodiment, a flash memory 400 includes a voltage generator 410, a word line decoder circuit 420, and a memory array 430, wherein the voltage generator 410 has been described in the embodiments with reference to FIG. 1 to FIG. 3. More specifically, the voltage generator 410 is coupled to the word line decoder circuit 420 to provide the work reference voltage VWG and receives the voltage adjustment signal STRX to adjust the voltage level of the work reference voltage VWG, wherein the voltage adjustment signal STRX has a plurality of trimming codes (CTR1 to CTRn as shown in FIG. 1). The word line decoder circuit 420 receives the work reference voltage VWG and a row address RA and then provides a row selection voltage VRS to the memory array 430, wherein the row address RA determines the word line to which the row selection voltage VRS is transmitted, and the work reference voltage VWG determines the voltage level of the row selection voltage VRS.

To conclude the above, in the voltage generator and the flash memory of the invention, through voltage division of multiple voltage trimming circuits, the switch components (e.g., thin film transistors) in the voltage trimming circuits are prevented from having an excessive voltage, which may lead to punch-through breakdown. Thereby, the voltage level of the work reference voltage can be locked correctly. Moreover, the resistances of the resistor series in different voltage trimming circuits may be set to be different, by which the number of the switches in the voltage trimming circuits may be reduced to save the circuit area for forming the switch components.

It will be apparent to those skilled in the art that various modifications and variations can be made to the disclosed embodiments without departing from the scope or spirit of this invention. In view of the foregoing, it is intended that the invention covers modifications and variations provided that they fall within the scope of the following claims and their equivalents.

What is claimed is:

1. A voltage generator adapted to provide a work reference voltage having a plurality of reference levels to a word line decoder circuit, the voltage generator comprising:
    a plurality of voltage trimming circuits connected in series between the work reference voltage and a ground voltage and respectively receiving a trimming code, wherein a voltage level of the work reference voltage is controlled by the trimming codes received by the voltage trimming circuits to select one of the reference levels;
    a charge pump receiving a gain voltage to provide the work reference voltage;
    an impedance circuit coupled in series between the work reference voltage and the voltage trimming circuits;
    a voltage divider coupled in series between the voltage trimming circuits and the ground voltage to provide a feedback voltage different from the work reference voltage; and
    a differential amplifier receiving the feedback voltage different from the work reference voltage and an operation reference voltage to provide the gain voltage.

2. The voltage generator according to claim 1, wherein each of the voltage trimming circuits comprises an input end, a control end, and an output end, wherein the input end is coupled to the work reference voltage or the output end of a previous one of the voltage trimming circuit, the control end receives the corresponding trimming code, and the output end is coupled to the input end of a following one of the voltage trimming circuit or the ground voltage.

3. The voltage generator according to claim 2, wherein each of the voltage trimming circuits comprises:
    a resistor series coupled to the output end and comprising a plurality of resistors connected in series, wherein each of the resistors comprises a first end and a second end;
    a plurality of switches each comprising a first end coupled to the input end, a second end coupled to the second end of the corresponding resistor, and a control end;
    a logic circuit receiving the corresponding trimming code to provide a plurality of switch signals; and
    a plurality of level shifters respectively coupled between the logic circuit and the control ends of the switches and controlling the switches according to the switch signals.

4. The voltage generator according to claim 3, wherein the number of the switches of the voltage trimming circuits is T', wherein n is larger than or equal to 1.

5. The voltage generator according to claim 1, wherein the voltage trimming circuits respectively receive the trimming codes having different bit numbers.

6. The voltage generator according to claim 5, wherein the trimming code received by the voltage trimming circuit that is closer to the work reference voltage has a larger bit number while the trimming code received by the voltage trimming circuit that is closer to the ground voltage has a smaller bit number.

7. The voltage generator according to claim 1, wherein the voltage trimming circuits receive the trimming codes having the same bit number.

8. A flash memory, comprising:
    a memory array;
    a word line decoder circuit receiving a work reference voltage and a row address to provide a row selection voltage to the memory array; and
    the voltage generator of claim 1 coupled to the word line decoder circuit to provide the work reference voltage and receiving a voltage adjustment signal to adjust a voltage level of the work reference voltage, wherein the voltage adjustment signal comprises a plurality of trimming codes.

* * * * *